United States Patent [19]
Chu et al.

[11] Patent Number: 5,250,860
[45] Date of Patent: Oct. 5, 1993

[54] THREE-LEVEL CASCODE DIFFERENTIAL CURRENT SWITCH

[75] Inventors: William M.-S. Chu, Hyde Park; Carl K.-L. Wong, Woodstock, both of N.Y.

[73] Assignee: International Business Machines Corporation, Armonk, N.Y.

[21] Appl. No.: 904,125

[22] Filed: Jun. 25, 1992

[51] Int. Cl.$^5$ .................................. H03K 19/092
[52] U.S. Cl. .............................. 307/475; 307/455; 307/472
[58] Field of Search ............... 307/443, 455, 471–472, 307/475, 264

[56] References Cited
U.S. PATENT DOCUMENTS

| | | | |
|---|---|---|---|
| 3,519,845 | 7/1970 | Larriva | 307/216 |
| 3,590,230 | 6/1971 | Nordquist | 235/176 |
| 3,648,064 | 3/1972 | Mukai et al. | 307/213 |
| 4,319,148 | 3/1982 | Malaviya | 307/471 |
| 4,615,010 | 9/1986 | Davis et al. | 307/465 X |
| 4,670,673 | 6/1987 | Varatanajan | 307/455 |
| 4,730,266 | 3/1988 | Van Meerbengen et al. | 307/472 X |
| 4,737,663 | 4/1988 | Varadarajan | 307/455 |
| 4,737,664 | 4/1988 | Wilhelm et al. | 307/455 |
| 4,751,404 | 6/1988 | Yueu | 307/455 X |
| 4,760,289 | 7/1988 | Eichelberger et al. | 307/455 |
| 5,012,128 | 4/1991 | Chan | 307/270 |
| 5,075,574 | 12/1991 | Boudon | 307/443 X |
| 5,160,857 | 11/1992 | Barre | 307/475 |

*Primary Examiner*—David R. Hudspeth
*Attorney, Agent, or Firm*—Lynn L. Augspurger

[57] ABSTRACT

A three-level input voltage level conversion circuit for three-level emitter coupled logic (ECL) cascode circuit provides three unique input levels. The input voltage level conversion circuit has a level shift up circuit for the top level input, a direct input to the middle level input, and a conventional emitter follower input for the bottom level input. The shift up circuit consists of a differential pair with differential inputs to the bases of each transistor. The collectors of these transistors are coupled to the upper level of the three-level cascode logic circuit. The emitters of the differential pair are coupled to the collector of a current source transistor. The base of the current source transistor is connected to an activation potential, and the emitter is coupled through a resistor to a reference potential. The down shift is accomplished with a differential transistor pair with bases directly coupled to a differential input pair. The collectors of these transistors are coupled to a positive potential and the emitters are coupled through resistors to a reference potential. The emitters are the differential output of the circuit and are directly coupled to the lower level of the cascode circuit.

9 Claims, 4 Drawing Sheets

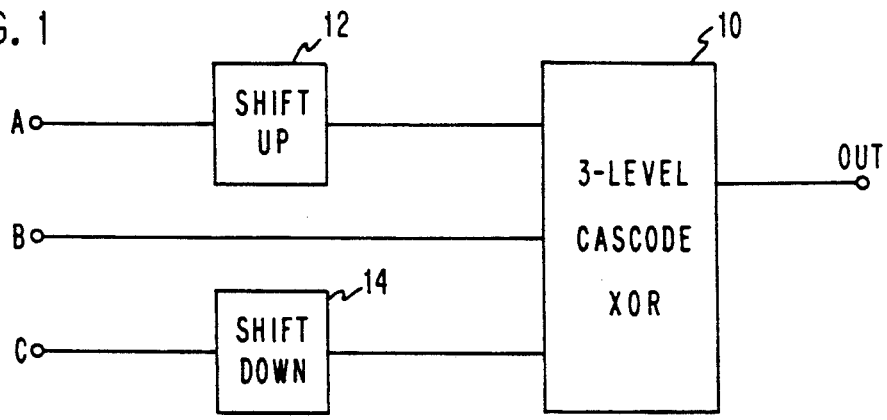
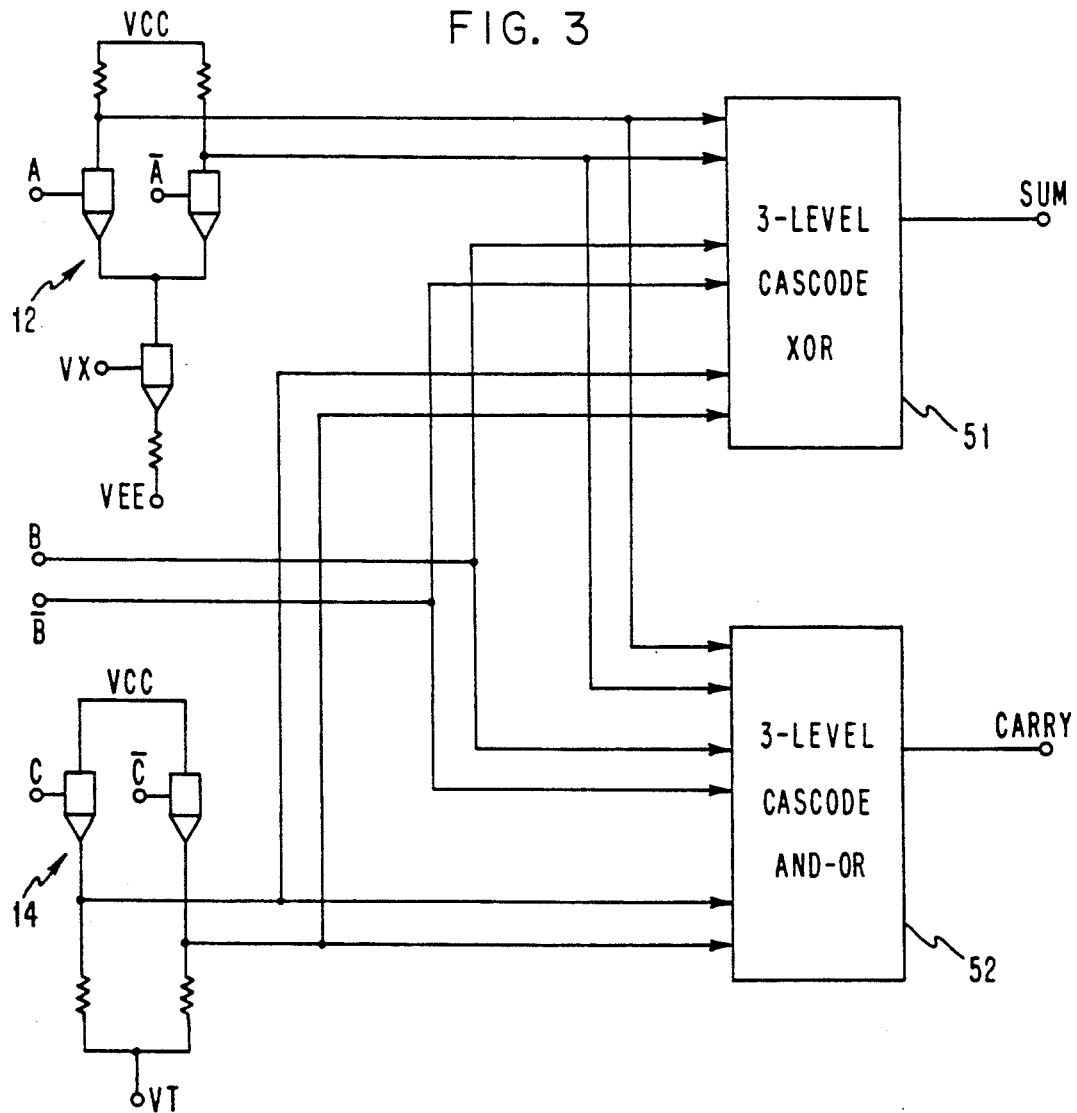

THREE-LEVEL CASCODE DIFFERENTIAL CURRENT SWITCH

BACKGROUND OF THE INVENTION

1. Field of the Invention

The present invention generally relates to cascode emitter coupled logic (ECL) circuits and, more particularly, to input voltage level conversion circuitry for three-level cascode logic circuits which make the three-level circuits compatible with a two-level circuit environment.

2. Description of the Prior Art

U.S. Pat. No. 4,760,289 to Eichelberger et al. discloses a two-level differential cascode current switch masterslice cell which is replicated in an array on a semiconductor chip. The masterslice cells are wireable to form any of a selected book set of basic logic circuits in a very large scale integrated (VLSI) circuit. The Eichelberger et al. circuit provides a twenty percent increased performance advantage over conventional emitter coupled logic (ECL) masterslice circuits running at the same power.

Three-level cascode circuits offer greater logic power for almost the same power dissipation when compared to two-level cascode circuits. In order for the three-level cascode circuit to work, however, three unique input levels are required. This generally requires higher supply voltage to avoid device saturation and excessive tolerance in the current source. Thus, the performance potential of three-level cascode masterslice circuits has not been realized because of the overhead associated with the supply voltage.

SUMMARY OF THE INVENTION

It is therefore an object of the present invention to simplify the input voltage level conversion circuitry required for three-level cascode logic circuits so as to realize the advantages of these circuits.

It is another object of the invention to provide circuit compatibility for three-level logic circuits with two-level circuit environments.

According to the invention, there is provided a three-level input circuit supplying three unique input levels. This is accomplished with a level shift up circuit for the top level input, a direct input to the middle level input, and a conventional emitter follower input for the bottom level input. The shift up circuit consists of a differential pair with differential inputs to the bases of each transistor. The collectors of these transistors are coupled to the upper level of the three-level cascode logic circuit. The emitters of the differential pair are coupled to the collector of a current source transistor. The base of the current source transistor is connected to an activation potential, and the emitter is coupled through a resistor to a reference potential. The down shift is accomplished with a differential transistor pair with bases directly coupled to a differential input pair. The collectors of these transistors are coupled to a positive potential and the emitters are coupled through resistors to a reference potential. The emitters are the differential output of the circuit and are directly coupled to the lower level of the cascode circuit.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a block diagram of a three-level cascode logic-circuit employing the up shift and down shift circuits according to the invention;

FIG. 3 is a block and schematic diagram of a full adder implemented with three-level cascode logic circuits according to the invention.

DETAILED DESCRIPTION OF A PREFERRED EMBODIMENT OF THE INVENTION

Figure 2:
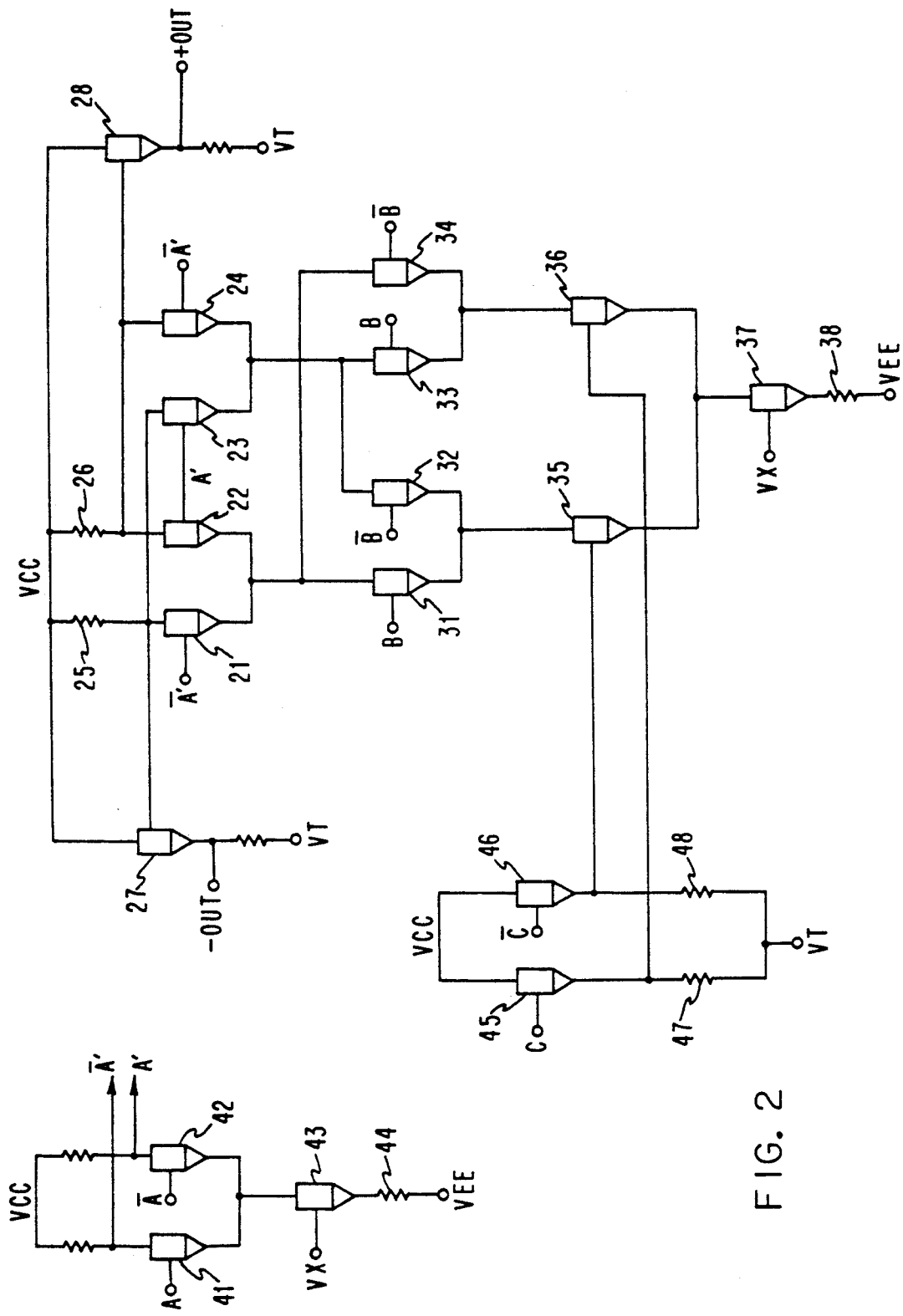
FIG. 2 is a schematic diagram of an Exclusive OR circuit as the logic circuit shown in FIG. 1.

Referring now to the drawings, and more particularly to FIG. 1, there is shown a block diagram of a three-level cascode logic circuit 10 having three inputs, denoted as A, B and C. The output of the logic circuit 10 is a Boolean logic function of the inputs A, B and C, here denoted as D. The invention uses a level shift up circuit 12 for the top level input A, a direct input to the middle level input B, and a conventional emitter follower 14 for the bottom level input C.

FIG. 2 shows a specific example where the three-level cascode logic circuit is a three-way Exclusive OR circuit. The upper level of this circuit is composed of two differential pairs of NPN transistors 21, 22 and 23, 24, the collectors of transistors 21 and 23 being connected via resistor 25 to a source of positive potential $V_{cc}$ and the collectors of transistors 22 and 24 being connected via resistor 26 to the source $V_{cc}$. In addition, the collectors of transistors 21 and 23 are connected to the base of NPN transistor 27 connected as an emitter follower which provides the complement of the output, or $\overline{D}$, where $D = A \oplus B \oplus C$. Similarly, the collectors of transistors 22 and 24 are connected to the base of NPN transistor 28 connected as an emitter follower which provides the output D.

The middle level of the cascode three-way Exclusive OR logic circuit comprises another two differential pairs of NPN transistors 31, 32 and 33, 34, the collectors of transistors 31 and 34 being connected to the emitters of transistors 21 and 22 and the collectors of transistors 32 and 33 being connected to the emitters of transistors 23 and 24. Input B is directly connected to the bases of transistors 31 and 33, while its complement $\overline{B}$ is directly connected to the bases of transistors 32 and 34.

The lower level to the cascode three-way Exclusive OR logic circuit comprises a single differential pair of NPN transistors 35, 36 having their emitters connected in common to the collector of NPN transistor 37 which functions as a current source for the tree of differential pairs of transistors which form the logic circuit. The base of transistor 37 is connected to an activation voltage source $V_x$, and its emitter is connected via resistor 38 to a voltage source $V_{cc}$.

This logic circuit requires a three-level input circuit providing three unique input levels. This is accomplished with the level shift up circuit 12 for the top level input, a direct input to the middle level input, and a conventional emitter follower input 14 for the bottom level input. The shift up circuit 12 consists of a differential pair of NPN transistors 41, 42 with differential inputs A and $\overline{A}$ to the bases of transistors 41 and 42, respectively. The collectors of these transistors are respectively coupled to the bases of transistors 22, 23 and transistors 21, 24 in the upper level of the three-level cascode logic circuit. The emitters of the differential pair are coupled to the collector of an NPN transistor 43 connected as a current source. The base of the current source transistor 43 is connected to the activation voltage source $V_x$, and its emitter is coupled via resistor 44 to the voltage source $V_{cc}$. Note that this current source transistor 43 is identical with current source transistor 37, simplifying the fabrication of the circuit.

The down shift is accomplished with a differential transistor pair of NPN transistors 45, 46 with bases directly coupled to the differential input pair C and $\overline{C}$. The collectors of these transistors are coupled to the positive voltage source $V_{cc}$, and the emitters are coupled through resistors 47 and 48 to a reference potential $V_T$. The emitters are the differential output of the circuit and are directly coupled respectively to the bases of transistors 36 and 35 of the lower level of the cascode Exclusive OR circuit. The differential input pair B and $\overline{B}$ directly connected to the bases of transistors 31, 33 and 32, 34, respectively, of the middle level of the cascode Exclusive OR circuit.

The advantage of the input voltage level conversion circuitry according to the invention is further illustrated in FIG. 3 which shows a full adder implemented with a three-level cascode Exclusive OR circuit 51 and a three-level cascode AND-OR circuit 52 producing respectively the sum and carry outputs of the full adder. Only a single level shift up circuit 12 and a single level shift down circuit 14 is required to supply the logic inputs to both the Exclusive OR circuit 51 and the AND-OR circuit 52.

Figure 4:
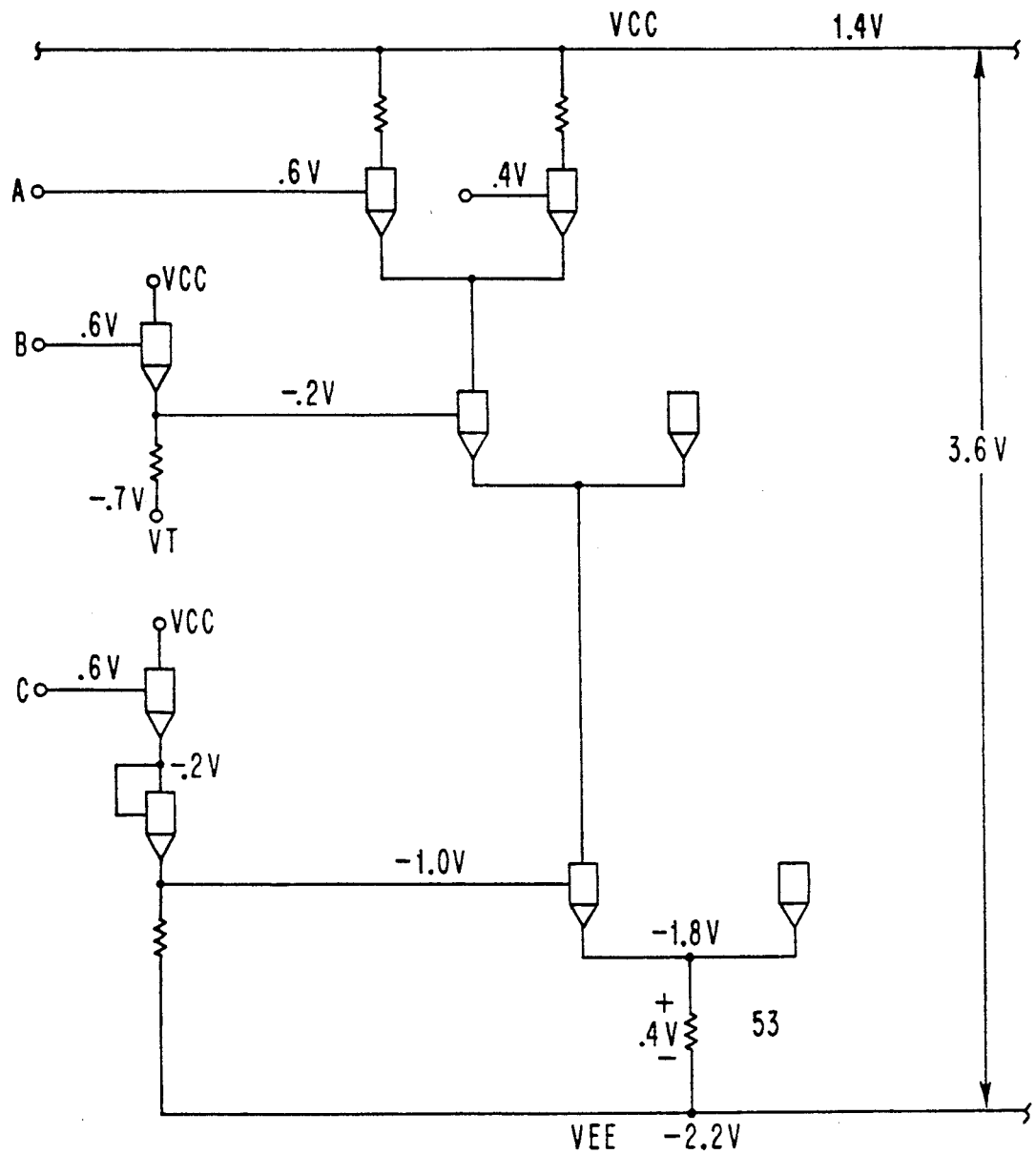
FIG. 4 is a schematic diagram of a conventional voltage level conversion circuit for a three-level cascode logic circuit.
Figure 5:
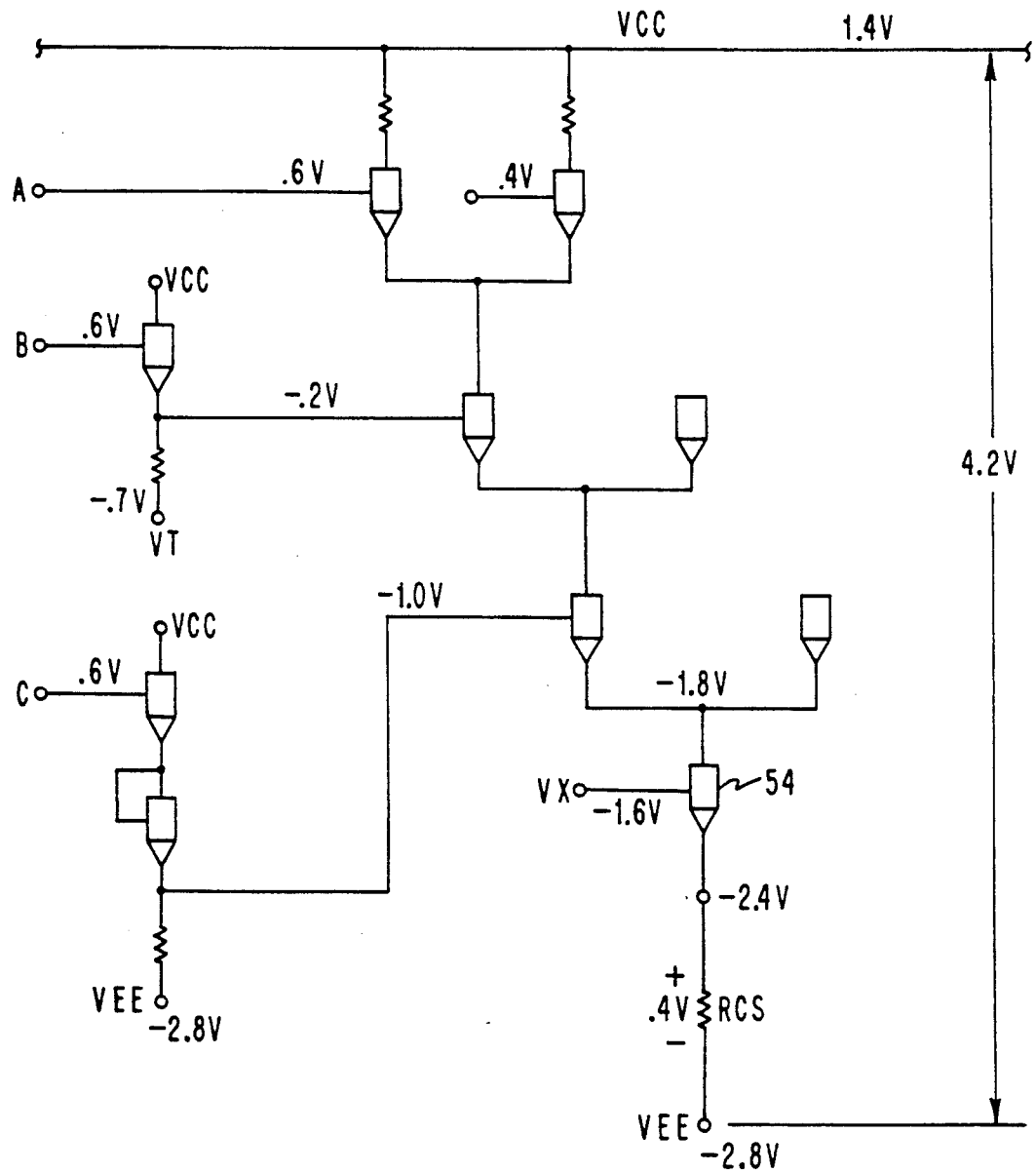
FIG. 5 is a schematic diagram of another prior art voltage level conversion circuit for a three-level cascode logic circuit which retains the standard current source but requires a higher potential difference.

In contrast to FIG. 2, FIG. 4 shows a conventional implementation of the input voltage conversion circuitry for a three-level cascode logic circuit. The standard current source is replaced by a resistor 53. The current through the logic tree is controlled by the up level voltage of input C. Since that logic signal can come from the output of any other logic circuits in the masterslice, the up-level voltage can have a range of values. This will cause the logic tree current to have a large tolerance which is very undesirable as that will in turn cause the output signal swing to have a large tolerance. FIG. 5 shows another prior art input voltage conversion circuit for a three-level cascode logic circuit. The standard current source, represented by NPN transistor 54, is retained, but it requires a larger potential difference between $V_{cc}$ and $V_{cc}$, resulting in higher power dissipation.

The advantage of the input voltage level conversion circuit according to the invention is that it allows retention of the current source and voltage supplies which are all compatible with the two-level cascode masterslice circuit disclosed, for example, by Eichelberger et al. In order to optimize the design and to save power, the delay through the top level input should be made the same as through the bottom level which is normally the slowest.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. Input voltage level conversion circuitry for three-level cascode logic circuits, said three-level cascode logic circuits having an upper level, middle level and lower level connected in a tree structure, a first standard current source connected to a base of said tree structure and each of said levels receiving respective differential inputs, said input circuitry comprising an upper level stage comprising an upshift circuit having a second standard current source identical to said first standard current source and translating a voltage level of a first pair of differential inputs to a higher level and connecting the translated voltage level to the upper level of one or more of said three-level cascode logic circuits, a middle level stage connecting a second pair of differential inputs directly connected to the middle level of one or more of said three-level cascode logic circuits, and a lower level stage comprising a downshift circuit translating a voltage level of a third pair of differential inputs to a lower level and connecting the translated voltage level to the lower level of one or more of said three-level cascode logic circuits.

2. The input voltage level conversion circuitry recited in claim 1 wherein said upshift circuit comprises a first transistor pair connected to a first pair of differential inputs, collectors of said first transistor pair being connected to a positive potential through first and second resistors respectively, emitters of said first transistor pair being connected to the collector of a current source transistor forming part of said second standard current source, the emitter of said current source transistor being connected to a first reference voltage through a third resistor, the base of said current source transistor being connected to a an activation potential, said collectors of said first transistor pair forming outputs of said upper level stage connected to differential inputs of the upper level of one or more of said three-level cascode logic circuits.

3. The input voltage level conversion circuitry recited in claim 2 wherein said downshift circuit comprises a second transistor pair, collectors of said second transistor pair being connected to said positive potential, emitters of said second transistor pair being connected to second reference potential through fourth and fifth resistors respectively, and bases of said second transistor pair being connected to a third pair of differential inputs, emitters of said second differential pair forming outputs of said lower level stage connected to differential inputs of the lower level of one or more of said three-level cascode logic circuits.

4. A three-level cascode Exclusive OR logic circuit having an upper level, middle level and lower level connected in a tree structure, a first standard current source connected to a base of said tree structure and each of said levels receiving respective differential inputs, and input circuitry comprising an upper level stage comprising an upshift circuit having a second standard current source identical to said first standard current source and translating a voltage level of a first pair of differential inputs to a higher level and connecting the translated voltage level to the upper level of said three-level cascode Exclusive OR logic circuit, a middle level stage connecting a second pair of differential inputs directly connected to the middle level of said three-level cascode Exclusive OR logic circuit, and a lower level stage comprising a downshift circuit translating a voltage level of a third pair of differential inputs to a lower level and connecting the translated voltage level to the lower level of said three-level cascode Exclusive OR logic circuit.

5. The combination of a three-level cascode Exclusive OR logic circuit and voltage level conversion circuitry recited in claim 4 wherein said upshift circuit comprises a first transistor pair connected to a first pair of differential inputs, collectors of said first transistor pair being connected to a positive potential through first and second resistors respectively, emitters of said first transistor pair being connected to the collector of a current source transistor forming part of said second standard current source, the emitter of said current source transistor being connected to a first reference voltage through a third resistor, the base of said current source transistor being connected to a an activation potential, said collectors of said first transistor pair forming outputs of said upper level stage connected to differential inputs of the upper level of said three-level cascode Exclusive OR logic circuit.

6. The combination of a three-level cascode Exclusive OR logic circuit and input voltage level conversion circuitry recited in claim 5 wherein said downshift circuit comprises a second transistor pair, collectors of said second transistor pair being connected to said positive potential, emitters of said second transistor pair being connected to second reference potential through fourth and fifth resistors respectively, and bases of said second transistor pair being connected to a third pair of differential inputs, emitters of said second differential pair forming outputs of said lower level stage connected to differential inputs of the lower level of said three-level cascode Exclusive OR logic circuit.

7. A full adder circuit comprising a three-level cascode Exclusive OR logic circuit and a three-level cascode AND-OR logic circuit each having an upper level, middle level and lower level connected in a tree structure, a first standard current source connected to a base of said tree structure and each of said levels receiving respective differential inputs, and input circuitry comprising an upper level stage comprising an upshift circuit having a second standard current source identical to said first standard current source and translating a voltage level of a first pair of differential inputs to a higher level and connecting the translated voltage level to the upper level of each of said three-level cascode Exclusive OR and AND-OR logic circuits, a middle level stage connecting a second pair of differential inputs directly connected to the middle level of each of said three-level cascode Exclusive OR and AND-OR logic circuits, and a lower level stage comprising a downshift circuit translating a voltage level of a third pair of differential inputs to a lower level and connecting the translated voltage level to the lower level of each of said three-level cascode Exclusive OR and AND-OR logic circuits.

8. The full adder recited in claim 7 wherein said upshift circuit comprises a first transistor pair connected to a first pair of differential inputs, collectors of said first transistor pair being connected to a positive potential through first and second resistors respectively, emitters of said first transistor pair being connected to the collector of a current source transistor forming part of said second standard current source, the emitter of said current source transistor being connected to a first reference voltage through a third resistor, the base of said current source transistor being connected to a an activation potential, said collectors of said first transistor pair forming outputs of said upper level stage connected to differential inputs of the upper level of each of said three-level cascode Exclusive OR and AND-OR logic circuits.

9. The full adder recited in claim 8 wherein said downshift circuit comprises a second transistor pair, collectors of said second transistor pair being connected to said positive potential, emitters of said second transistor pair being connected to second reference potential through fourth and fifth resistors respectively, and bases of said second transistor pair being connected to a third pair of differential inputs, emitters of said second differential pair forming outputs of said lower level stage connected to differential inputs of the lower level of each of said three-level cascode Exclusive OR and AND-OR logic circuits.

* * * * *